(12) United States Patent
Jang et al.

(10) Patent No.: US 7,045,846 B2
(45) Date of Patent: May 16, 2006

(54) MEMORY DEVICE AND METHOD FOR FABRICATING THE SAME

(75) Inventors: Se-Aug Jang, Kyoungki-do (KR);
Tae-Woo Jung, Kyoungki-do (KR);
Seo-Min Kim, Kyoungki-do (KR);
Woo-Jin Kim, Kyoungki-do (KR);
Hyung-Soon Park, Kyoungki-do (KR);
Young-Bog Kim, Kyoungki-do (KR);
Hong-Seon Yang, Kyoungki-do (KR);
Hyun-Chul Sohn, Kyoungki-do (KR);
Eung-Rim Hwang, Kyoungki-do (KR)

(73) Assignee: Hynix Semiconductor Inc., (KR)

( * ) Notice: Subject to any disclaimer, the term of this patent is extended or adjusted under 35 U.S.C. 154(b) by 0 days.

(21) Appl. No.: 11/053,704

(22) Filed: Feb. 7, 2005

(65) Prior Publication Data

US 2006/0022249 A1 Feb. 2, 2006

(30) Foreign Application Priority Data

Jul. 27, 2004 (KR) .......................... 10-2004-58871
Jul. 29, 2004 (KR) .......................... 10-2004-59670

(51) Int. Cl.
*H01L 27/108* (2006.01)
(52) U.S. Cl. ................. 257/306; 257/E27.088
(58) Field of Classification Search ................ 257/306, 257/E27.088; 438/253
See application file for complete search history.

(56) References Cited

U.S. PATENT DOCUMENTS

| 5,040,036 | A | * | 8/1991 | Hazani .................. 365/185.28 |
| 5,162,247 | A | * | 11/1992 | Hazani ........................ 438/259 |
| 5,477,071 | A | * | 12/1995 | Hamamoto et al. ......... 257/302 |
| 6,048,767 | A | * | 4/2000 | Terada ......................... 438/262 |
| 6,297,143 | B1 | * | 10/2001 | Foote et al. ................. 438/618 |
| 6,472,696 | B1 | * | 10/2002 | Zimmermann et al. ..... 257/204 |
| 6,617,633 | B1 | * | 9/2003 | Huang ......................... 257/296 |
| 2003/0122171 | A1 | * | 7/2003 | Huang ......................... 257/296 |

* cited by examiner

*Primary Examiner*—George Fourson
(74) *Attorney, Agent, or Firm*—Blakely Sokoloff Taylor & Zafman

(57) ABSTRACT

Disclosed are a memory device and a method for fabricating the same. The memory device includes: a substrate provided with a trench; a bit line contact junction formed beneath the trench; a plurality of storage node contact junctions formed outside the trench; and a plurality of gate structures each being formed on the substrate disposed between the bit line contact junction and one of the storage node contact junctions. Each sidewall of the trench becomes a part of the individual channels and thus, channel lengths of the transistors in the cell region become elongated. Accordingly, the storage node contact junctions have a decreased level of leakage currents, thereby increasing data retention time.

20 Claims, 10 Drawing Sheets

MEMORY DEVICE AND METHOD FOR
FABRICATING THE SAME

FIELD OF THE INVENTION

The present invention relates to a memory device and a method for fabricating the same; and more particularly, to a memory device capable of improving a data retention time and a method for fabricating the same.

DESCRIPTION OF RELATED ARTS

As semiconductor devices have been increasingly scaled down, each pattern size has been decreased gradually. Particularly, in a memory device such as a dynamic random access memory (DRAM) device, lengths of gate electrodes have been dramatically decreased in proportion to a decrease in sizes of transistors in a cell region owing to the large scale of integration, and as a result of the scaled down gate electrodes, source and drain junctions have played an important role for an electric field and an electric potential exerted on bodies of the transistors in the cell region.

FIG. 1 is a cross-sectional view showing a structure of a conventional memory device.

As shown, a field oxide layer 120 for isolating device elements is formed in predetermined regions of a substrate 110. Then, a gate insulation layer 130, a first gate conductive layer 140, a second gate conductive layer 150 and a gate hard mask layer 160 are sequentially formed on the substrate 110 and are subsequently subjected to a gate mask process and an etching process, thereby obtaining a plurality of gate structures 155.

Next, impurities are ion-implanted to form a plurality of bit line contact junctions 170A and a plurality of storage node contact junctions 170B, and then, a spacer 171 is formed on each sidewall of the gate structures 155. Afterwards, a plurality of bit line contact plugs 190A connected with the bit line contact junctions 170A and a plurality of storage node contact plugs 190B connected with the storage node contact junctions 170B are formed. The bit line contact plugs 190A and the storage node contact plugs 190B are for making a connection with bit lines and storage nodes, respectively. It should be noted that only the single bit line contact junction and the single bit line contact plug are illustrated in FIG. 1.

However, the convention memory device has a problem of a short channel effect in that a channel region is susceptible to a voltage provided from the gate structures, depletion layers of the source and drain junctions, an electric field and an electric potential because of the shortened gate electrode. As a result of the disadvantageous short channel effect, a threshold voltage decreases drastically, thereby resulting in a difficulty in controlling the threshold voltage of the memory device.

Also, as the memory device has been scaled down, it is necessary to ion-implant the bit line contact junctions 170A and the storage node contact junctions 170B with high concentration. However, because of the excessive ion-implantation to obtain a high doping concentration, edge regions A of the storage node contact junctions 170B in a cell region have a high level of electric field and thus, junction leakage currents increase at a junction portion of the storage node contact junctions 170B. The increase in the junction leakage current causes a data retention time to decrease. That is, a refresh characteristic of the memory device is degraded.

SUMMARY OF THE INVENTION

It is, therefore, an object of the present invention to provide a memory device capable of increasing a data retention time by decreasing a junction leakage current created at a storage node contact junction and a method for fabricating the same.

In accordance with an aspect of the present invention, there is provided a memory device, including: a substrate provided with a trench; a bit line contact junction formed beneath the trench; a plurality of storage node contact junctions formed outside the trench; and a plurality of gate structures each formed on the substrate disposed between the bit line contact junction and one of the storage node contact junctions.

In accordance with another aspect of the present invention, there is provided a memory device, including: a substrate provided with a trench; a first contact junction formed beneath the trench; a plurality of second contact junctions formed outside the trench; a plurality of gate structures each formed on the substrate disposed between the first contact junction and one of the second contact junctions; a first contact plug formed on the first contact junction by filling a space created between the gate structures; and a plurality of second contact plugs formed on the second contact junctions by filling a space created between the gate structures.

In accordance with a further aspect of the present invention, there is provided a method for fabricating a memory device, including the steps of: etching a portion of a substrate to thereby obtain a trench; forming a plurality of gate structures such that one portion of each of the gate structures is disposed within the trench; performing an ion-implantation process with use of the gate structures as a mask to thereby form a first contact junction beneath the trench and a plurality of second contact junctions outside the trench; and forming a first contact plug on the first contact junction and a plurality of second contact plugs on the respective contact junctions.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A memory device and a method for fabricating the same in accordance with preferred embodiments of the present invention will be described in detail with reference to the accompanying drawings.

Figure 1:
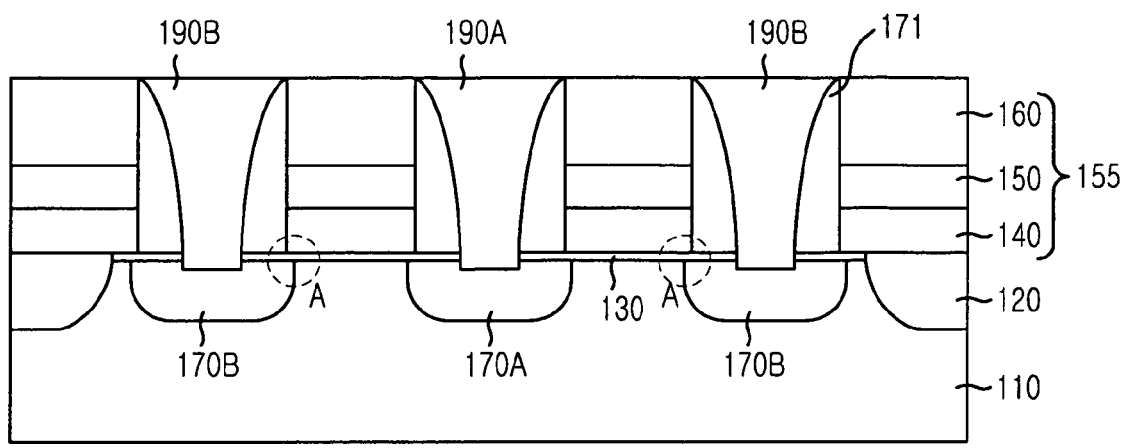
FIG. 1 is a cross-sectional view showing a structure of a conventional memory device.
Figure 2:
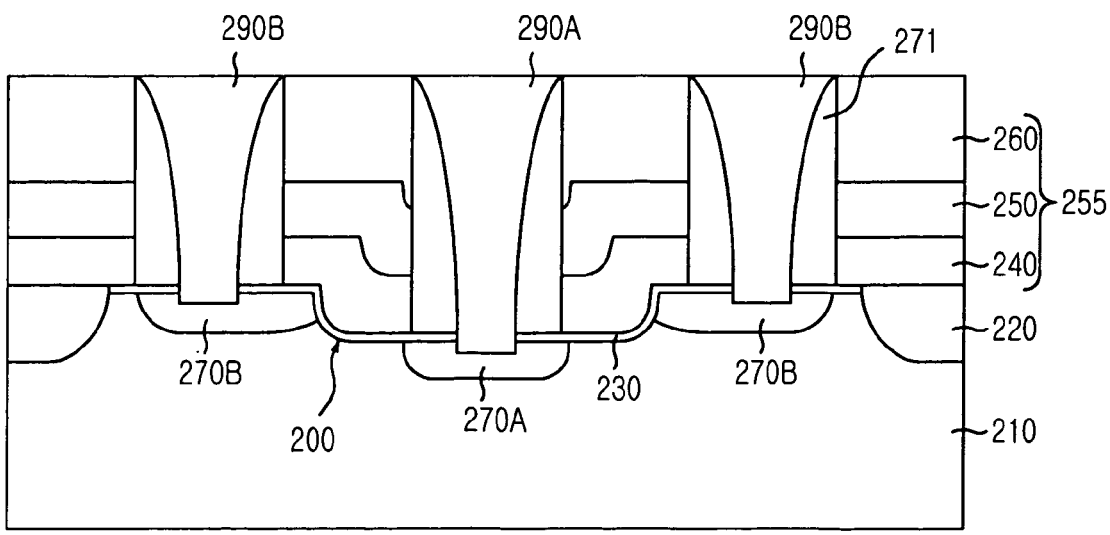
FIG. 2 is a cross-sectional view showing a structure of the memory device fabricated in accordance with a first embodiment of the present invention.

FIG. 2 is a cross-sectional view showing a structure of a memory device in accordance with a first embodiment of the present invention.

As shown, a field oxide layer 220 is formed in a substrate 210, and a trench 200 is formed in a predetermined region of the substrate 210. A first contact junction 270A is formed in the substrate 210 disposed beneath the trench 200, while a plurality of second contact junctions 270B are formed in the substrate 210 disposed outside the trench 200. It should be noted that only the single first contact junction 270A is illustrated in FIG. 2 although a number of the first contact junctions 270A are formed.

A plurality of gate structures 255 are formed on portions of the substrate 210 each disposed between the first contact junction 270A and the second contact junction 270B. Herein, each of the gate structures 255 includes a first insulation layer 230, a polysilicon layer 240, a metal layer 250 and a second insulation layer 260 for use in a hard mask. Also, one portion of each of the selected gate structures 255 is disposed within the trench 200, and the polysilicon layer 240 and the metal layer 250 of those gate structures 255 are indented where the trench 200 is formed.

A spacer 271 is formed on each sidewall of the gate structure 255. A first contact plug 290A is formed on the first contact junction 270A while filling a space created between the gate structures 255 formed on the trench 200. A plurality of second contact plugs 290B are formed on the respective second contact junctions 270B while filling corresponding spaces created between the gate structures 255 formed outside the trench 200.

Although not illustrated, a bit line is connected with the first contact junction 270A through the first contact plug 290A, and storage nodes are connected with the second contact junctions 270B through the second contact plugs 290B. That is, the first contact plug 290A and the second contact plugs 290B are a bit line contact plug and the storage node contact plugs, respectively, and the first contact junction 270A and the second contact junctions 270B are a bit line contact junction and storage node contact junctions, respectively.

As described above, the memory device fabricated in accordance with the first embodiment of the present invention, bit line contact junctions of transistors in a cell region are formed within the trench, while the storage node contact junctions are formed outside the trench. A number of channels are formed between each pair of the bit line contact junctions and the storage node contact junctions. Therefore, sidewalls of the trench constitute the channels and as a result, channel lengths of the transistors in the cell region become elongated. In comparison with the conventional memory device, a distance between each pair of the storage node contact junctions and the channel regions is greater.

Accordingly, the storage node contact junctions have a decreased level of leakage currents, thereby increasing a data retention time.

FIGS. 3A to 3F are cross-sectional views illustrating a method for fabricating a memory device in accordance with the first embodiment of the present invention. Herein, the same reference numerals described in FIG. 2 are used in these drawings.

Figure 3A:
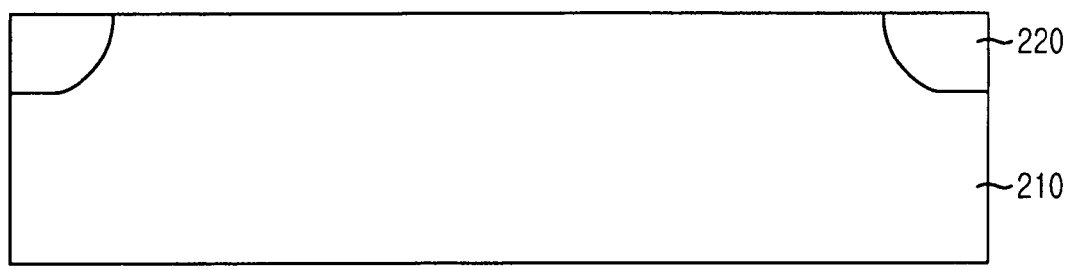
FIGS. 3A to 3F are cross-sectional views illustrating a method for fabricating a memory device in accordance with the first embodiment of the present invention.

Referring to FIG. 3A, a field oxide layer 220 is formed on a silicon-based substrate 210.

Figure 3B:
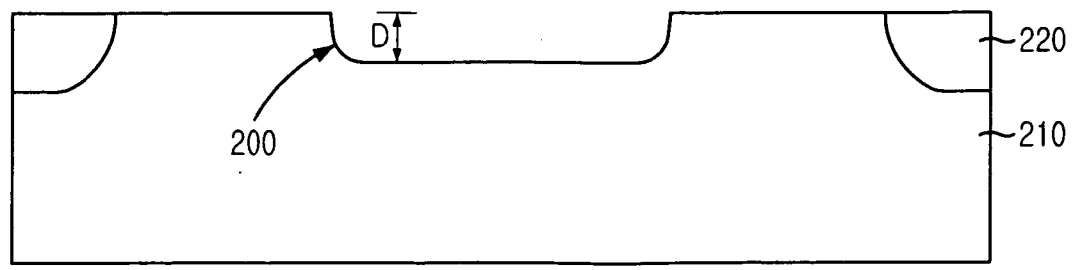

Referring to FIG. 3B, a predetermined portion of the substrate 210 is etched selectively to form a trench 200. Although a depth D of the trench 200 varies depending on the design rule, the depth D of the trench 200 is preferably in a range from approximately 20 nm to approximately 150 nm.

Figure 3C:
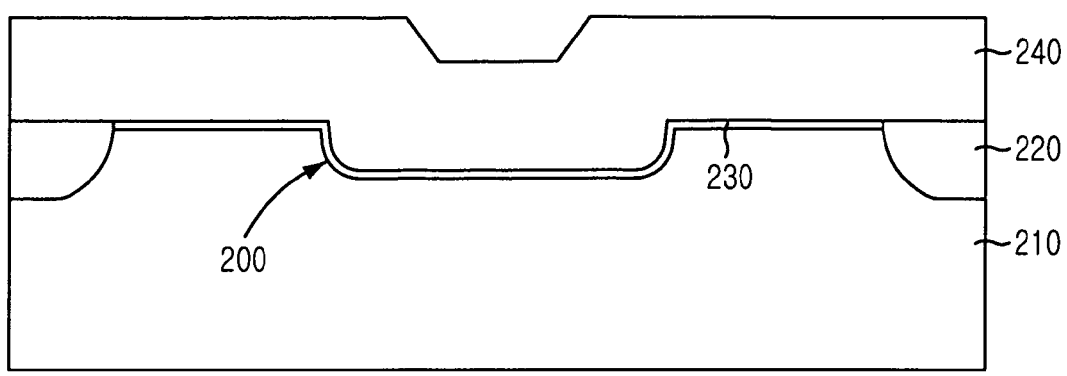

Referring to FIG. 3C, a first insulation layer 230 made of silicon oxide is formed on the above resulting substrate structure, and a polysilicon layer 240 and a metal layer 250 are sequentially formed thereon. At this time, the polysiliocn layer 240 has an indented profile identical to the profile of the trench 200.

Figure 3D:
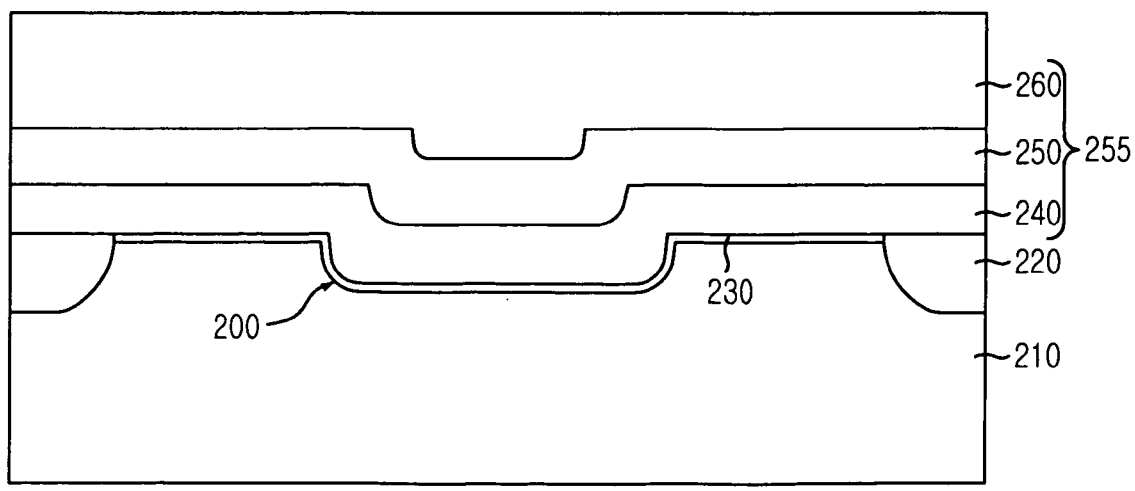

Referring to FIG. 3D, a metal layer 250 is formed on the polysilicon layer 240 by using a material selected from a metal and metal silicide. At this time, the metal layer has an indented portion at which the polysilicon layer 240 is indented. Afterwards, a second insulation layer 260 for use in a hard mask is formed on the metal layer 250. Typically, the second insulation layer 260 is made of silicon nitride.

Figure 3E:
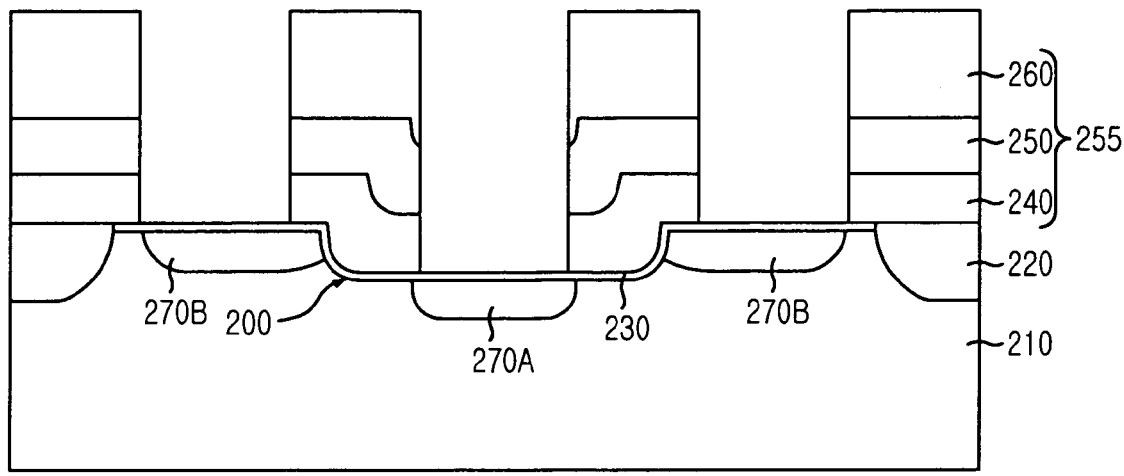

Referring to FIG. 3E, the first insulation layer 230, the polysilicon layer 240, the metal layer 250 and the second insulation layer 260 are selectively etched through a gate mask process and an etching process, thereby obtaining a plurality of gate structures 255. It is possible to perform a re-oxidation process for the purpose of repairing damage to the substrate structure during the etching process and improving characteristics of the first insulation layer 230. Then, an ion-implantation process is performed with use of the gate structures 255 as a mask to form a first contact junction 270A in the substrate 210 disposed beneath the trench 200 and to form a plurality of second junctions 270B in the substrate 210 disposed outside the trench 200.

Figure 3F:
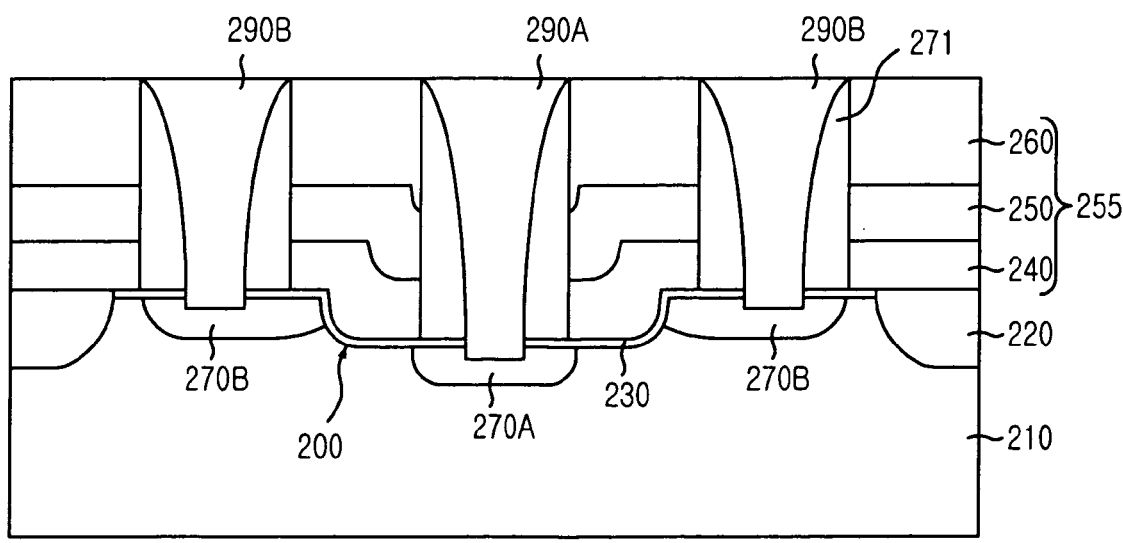

Referring to FIG. 3F, a spacer 271 is formed on each sidewall of the gate structures 255. At this time, the spacer 271 is formed by using nitride or oxide. Afterwards, a conductive layer for use in a contact plug is formed over the gate structures 255 and is then subjected to a CMP process which continues until the conductive layer is exposed. After the CMP process, a first contact plug 290A is formed on the first contact junction 270A, while a plurality of second contact plugs 290B are formed on the second contact junctions 270B. Although the single first contact junction 270A and the first contact plug 290A are illustrated, it should be noted that there are a plurality of the first contact junctions 270A and the first contact plugs 290A.

Although not illustrated, the first contact junction 270A is connected with a bit line through the first contact plug 290A, and the second contact junctions 270B are connected with storage nodes through the second contact plugs 290B. However, the first contact junction 270A and the second contact junctions 270B can be connected with the bit line and the storage nodes without employing the first contact plug 290A and the second contact plugs 290B, respectively.

In accordance with the first embodiment of the present invention, the first contact junction 270A with which the bit line is connected is formed in the substrate within the trench 200, so that sidewalls of the trench 200 constitute channel regions of transistors in a cell region.

Figure 4:
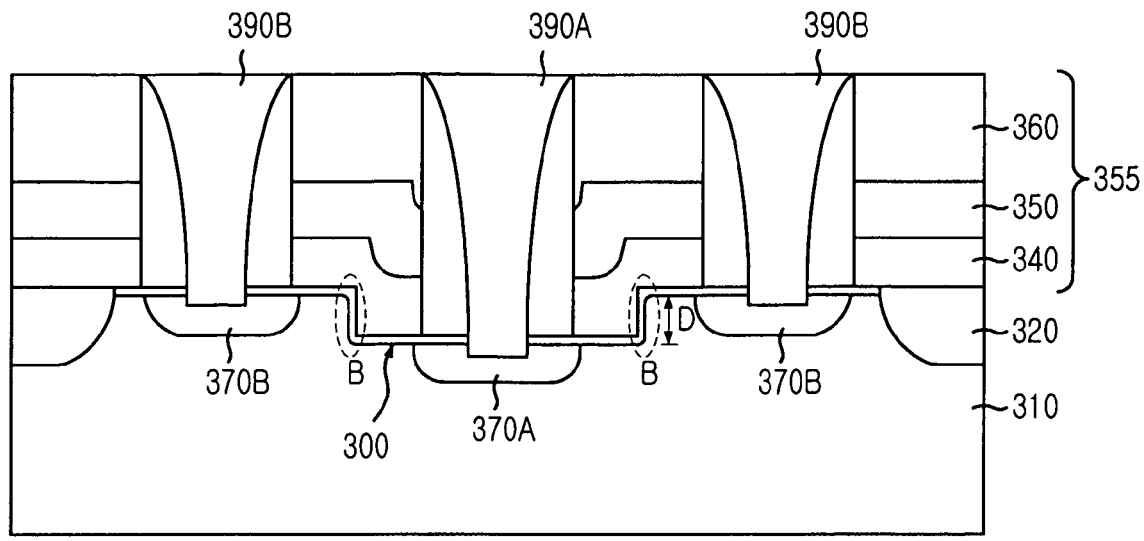
FIG. 4 is a cross-sectional view showing a structure of a memory device in accordance with a second embodiment of the present invention.

FIG. 4 is a cross-sectional view showing a structure of a memory device in accordance with a second embodiment of the present invention.

Herein, the memory device in accordance with the second embodiment includes the same configuration elements described in FIG. 2, and thus, a detailed description of such configuration elements will be omitted. However, the memory device fabricated in accordance with the second embodiment is different from the memory device fabricated in accordance with the first embodiment in that sidewalls B of a trench 300 are formed to be perpendicular to a surface of the indented portion of the substrate 310 and a plurality of gate structures 355, a first contact junction 370A and a second contact junction 370B are disposed such that portions of the substrate 310 where the sidewalls B of the trench 300 are disposed are allocated in the center of the individual channel regions.

Figure 5:
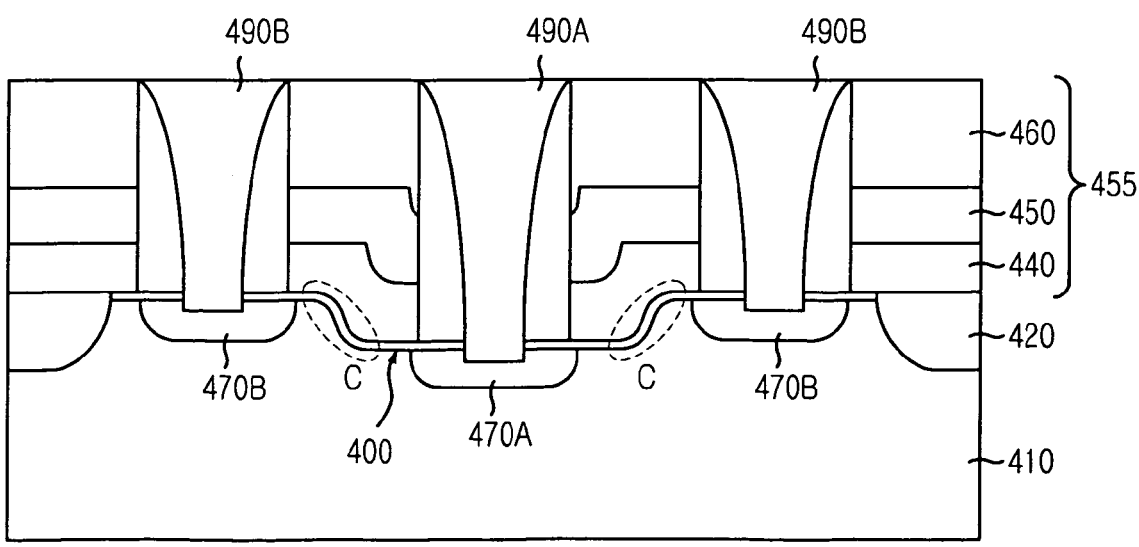
FIG. 5 is a cross-sectional view showing a structure of a memory device in accordance with a third embodiment of the present invention.

FIG. 5 is a cross-sectional view showing a structure of a memory device in accordance with a third embodiment of the present invention.

Herein, the memory device in accordance with the third embodiment of the present invention includes the same configuration elements described in FIG. 2 and thus, a detailed description of such configuration elements will be omitted. However, the memory device fabricated in accordance with the third embodiment is different from the memory device shown in FIG. 2 in that sidewalls C of a trench 400 are positively sloped by being narrowed down going towards a bottom portion of the trench 400.

Figure 6:
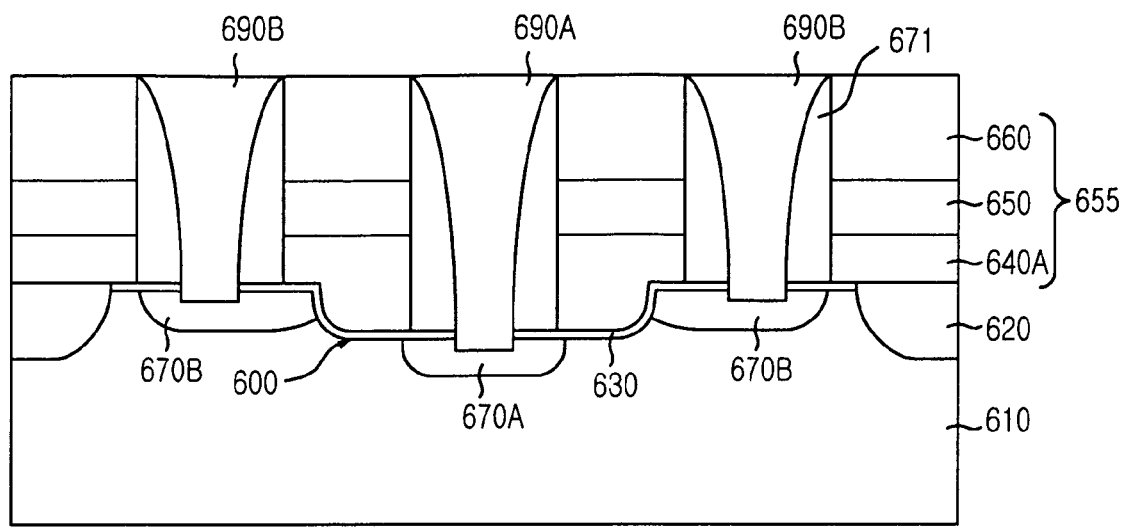
FIG. 6 is a cross-sectional view showing a structure of the memory device fabricated in accordance with a fourth embodiment of the present invention.

FIG. 6 is a cross-sectional view showing a structure of a memory device in accordance with a fourth embodiment of the present invention.

As shown, a field oxide layer 620 is formed in a substrate 610, and a trench 600 is formed in a predetermined region of the substrate 610. A first contact junction 670A is formed in the substrate 610 disposed beneath the trench 600, while a plurality of second contact junctions 670B are formed in the substrate 210 disposed outside the trench 600. It should be noted that only the single first contact junction 670A is illustrated in FIG. 2 although a number of the first contact junctions 670A are formed.

A plurality of gate structures 655 are formed on portions of the substrate 610 each disposed between the first contact junction 670A and the second contact junction 670B. Herein, each of the gate structures 655 includes a first insulation layer 630, a planarized polysilicon layer 640A, a metal layer 650 and a second insulation layer 660 for use in a hard mask. Also, one portion of each of the selected gate structures 655 is disposed within the trench 600. A spacer 671 is formed on each sidewall of the gate structure 655. A first contact plug 690A is formed on the first contact junction 670A while filling a space created between the gate structures 655 of which portions are disposed inside the trench 600. A plurality of second contact plugs 690B are formed on the respective second contact junctions 670B while filling corresponding spaces created between the gate structures 655 formed outside the trench 600.

Although not illustrated, a bit line is connected with the first contact junction 670A through the first contact plug 690A, and storage nodes are connected with the second contact junctions 670B through the second contact plugs 690B. That is, the first contact plug 690A and the second contact plugs 690B are a bit line contact plug and storage node contact plugs, respectively, and the first contact junction 670A and the second contact junctions 670B are a bit line contact junction and storage node contact junctions, respectively.

As described above, for the memory device fabricated in accordance with the fourth embodiment of the present invention, bit line contact junctions of transistors in a cell region are formed within the trench, while the storage node contact junctions are formed outside the trench. A number of channels are formed between each pair of the bit line contact junctions and the storage node contact junctions. Therefore, sidewalls of the trench become a part of the channels and as a result, channel lengths of the transistors in the cell region become elongated. In comparison with the conventional memory device, a distance between each pair of the storage node contact junctions and the channel regions is greater. Accordingly, the storage node contact junctions have a decreased level of leakage currents, thereby increasing a data retention time.

FIGS. 7A to 7G are cross-sectional views illustrating a method for fabricating a memory device in accordance with the fourth embodiment of the present invention. Herein, the same reference numerals described in FIG. 6 are used for the same configuration elements in these drawings.

Figure 7A:
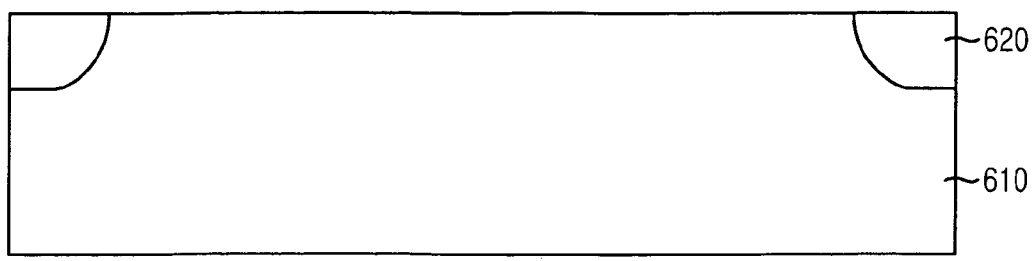
FIGS. 7A to 7G are cross-sectional views illustrating a method for fabricating a memory device in accordance with the fourth embodiment of the present invention.

Referring to FIG. 7A, a field oxide layer 620 is formed on a silicon-based substrate 610.

Figure 7B:
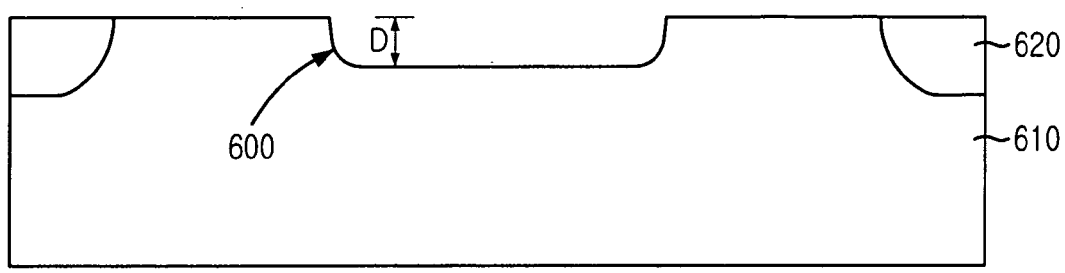

Referring to FIG. 7B, a predetermined portion of the substrate 610 is etched selectively to form a trench 600. Although a depth D of the trench 600 varies depending on the design rule, the depth D of the trench 600 is preferably in a range from approximately 20 nm to approximately 150 nm.

Figure 7C:
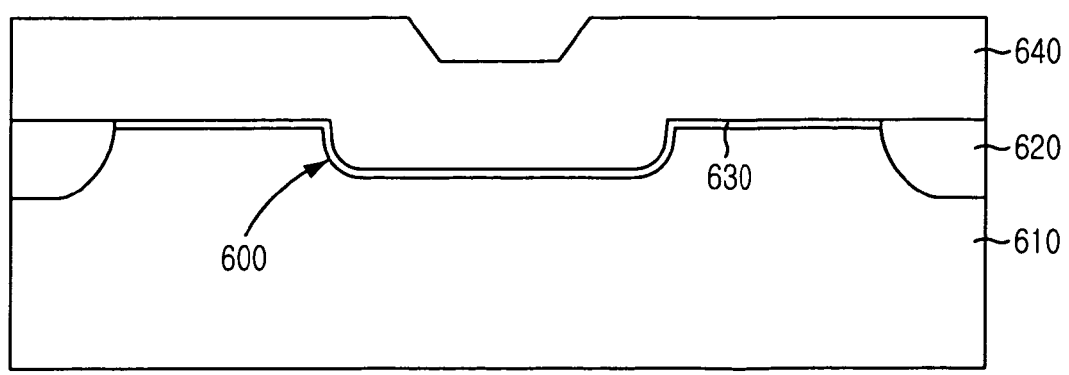

Referring to FIG. 7C, a first insulation layer 630 made of silicon oxide is formed on the above resulting substrate structure, and a polysilicon layer 640 is formed thereon. Preferably, the polysiliocn layer 640 has a thickness equal to or less than approximately 10,000 Å. At this time, the polysilicon layer 640 has an indented profile identical to the profile of the trench 600. That is, the polysilicon layer 640 has an indented portion which induces a metal layer which will be subsequently formed to be indented at the same position where the polysilicon layer 640 is indented.

However, because of characteristics of the employed metal, voids are generated and thus, those polymers produced during a subsequent etching process penetrate into the voids. As a result, the penetration of the polymers may block the etching process from being performed efficiently. To solve this problem, a different approach is proposed in the first embodiment of the present invention. Detailed description on the proposed approach will be described with reference to the accompanying drawings.

Figure 7D:
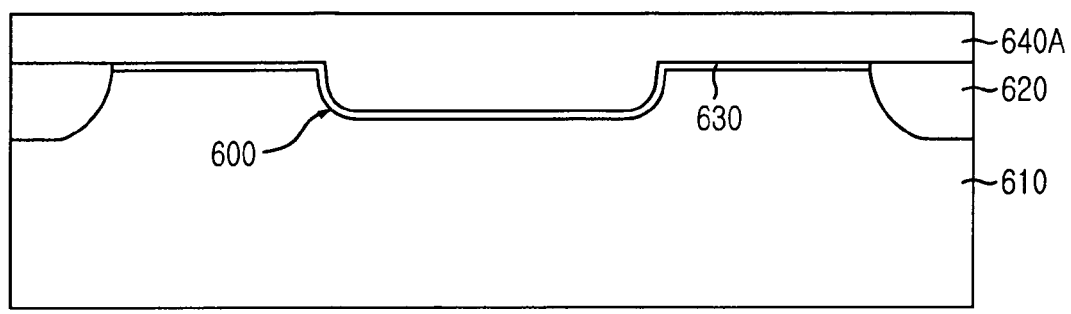

Referring to FIG. 7D, before the metal layer is formed on the polysilicon layer 640, a chemical mechanical polishing (CMP) process is performed to remove the trench 600, so that a planarized polysilicon layer 640A is obtained. At this time, a polishing pad used for the above CMP process is made of high molecular polymers, and an average size of polishing grains preferably ranges from approximately 10 nm to approximately 1,000 nm. Also, a surface of the polishing pad is formed in a sponge structure of which pore has a diameter less than approximately 100 μm, and the polishing grains of a slurry preferably has a concentration ranging from approximately 0.5 weight percent to approximately 5 weight percent.

Figure 7E:
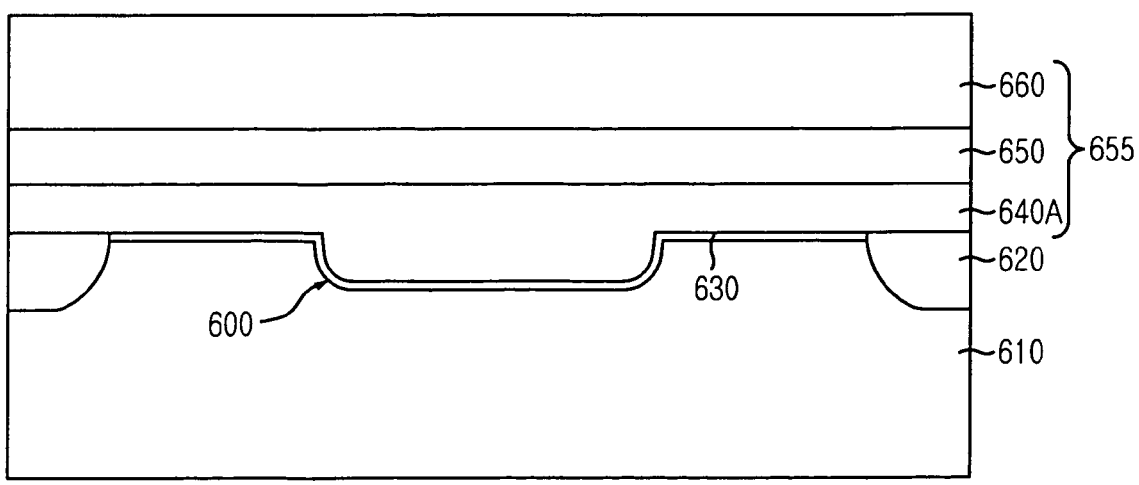

Referring to FIG. 7E, the aforementioned metal layer 650 based on a metal or metal silicide is formed on the planarized polysilicon layer 640A. Especially, the metal layer is preferably formed by using a material selected from tungsten and tungsten compounds. Afterwards, a second insulation layer 660 for use in a hard mask is formed on the metal layer 650. Typically, the second insulation layer 660 is made of silicon nitride.

Figure 7F:
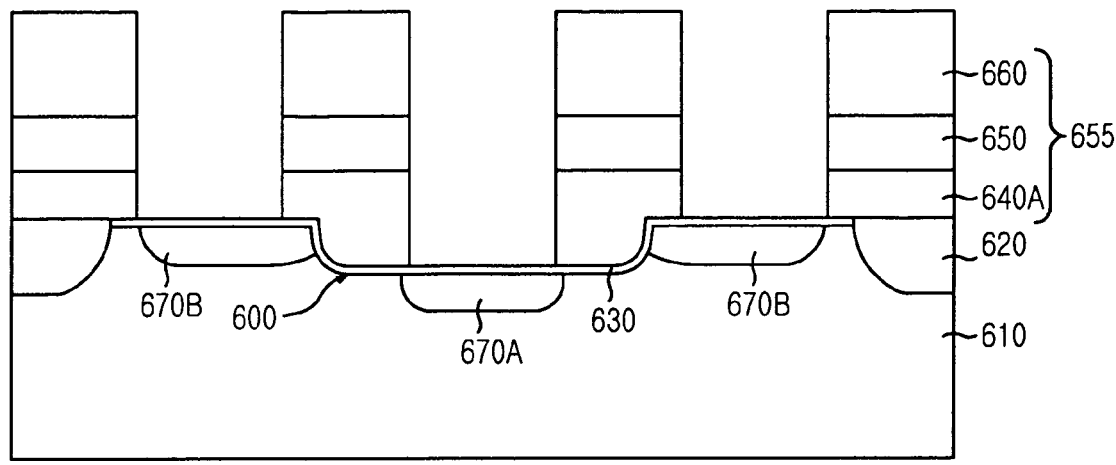

Referring to FIG. 7F, the first insulation layer 630, the planarized polysilicon layer 640A, the metal layer 650 and the second layer 660 are selectively etched through a gate mask process and an etching process, thereby obtaining a plurality of gate structures 655. It is possible to perform a re-oxidation process for the purpose of recovering damages to the substrate structure during the etching process and improving characteristics of the first insulation layer 660. Then, an ion-implantation process is performed with use of the gate structures 655 as a mask to form a first contact junction 670A in the substrate 610 disposed beneath the trench 600 and to form a plurality of second junctions 670B in the substrate 610 disposed outside the trench 600.

Figure 7G:
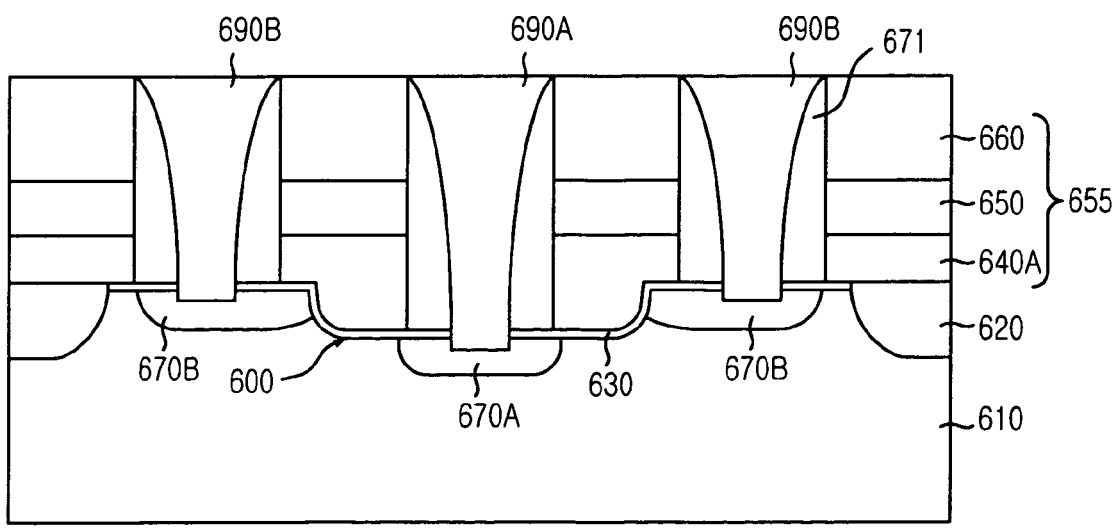

Referring to FIG. 7G, a spacer 671 is formed on each sidewall of the gate structures 655. At this time, the spacer 671 is formed by using nitride or oxide. Afterwards, a conductive layer for use in a contact plug is formed over the gate structures 655 and is then subjected to a CMP process which continues until the conductive layer is exposed. After the CMP process, a first contact plug 690A is formed on the first contact junction 670A, while a plurality of second contact plugs 690B are formed on the second contact junctions 670B. Although the single first contact junction 270A and the first contact plug 290A are illustrated, it should be noted that there are a plurality of the first contact junctions 670A and the first contact plugs 690A.

Although not illustrated, the first contact junction 670A is connected with a bit line through the first contact plug 690A, and the second contact junction 670B is connected with storage nodes through the second contact plugs 690B. However, the first contact junction 670A and the second contact junctions 670B can be connected with the bit line and the storage nodes without employing the first contact plug 690A and the second contact plugs 690B, respectively.

In accordance with the fourth embodiment of the present invention, the first contact junction 670A with which the bit line is connected is formed in the substrate disposed beneath the trench 600, so that sidewalls of the trench 600 constitute channels of transistors in a cell region.

Figure 8:
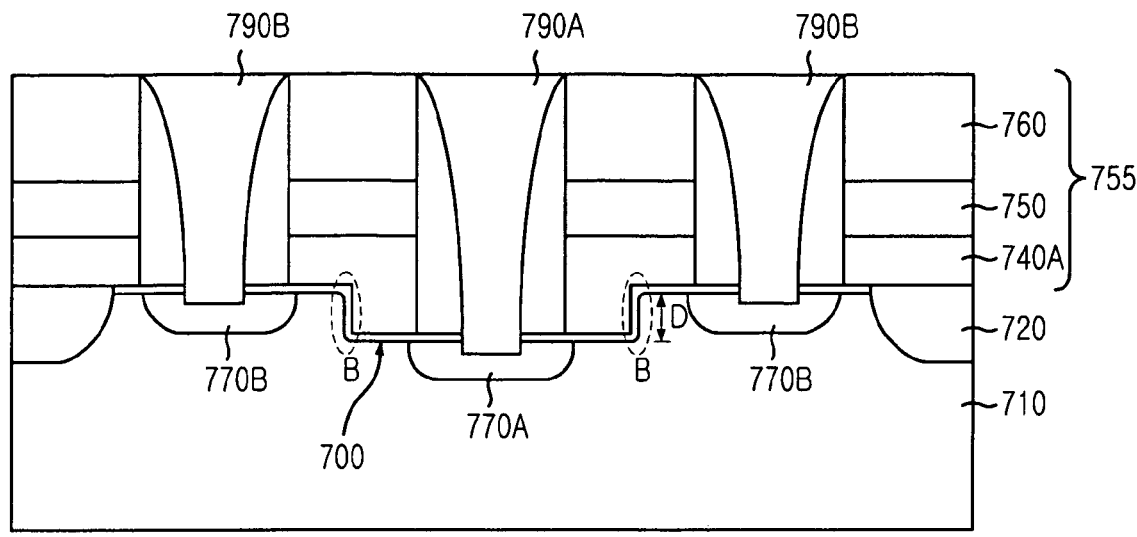
FIG. 8 is a cross-sectional view showing a structure of a memory device in accordance with a fifth embodiment of the present invention.

FIG. 8 is a cross-sectional view showing a structure of a memory device in accordance with a fifth embodiment of the present invention.

Herein, the memory device in accordance with the fourth embodiment includes the same configuration elements described in FIG. 6, and thus, a detailed description of such configuration elements will be omitted. However, the memory device fabricated in accordance with the fifth embodiment is different from the memory device fabricated in accordance with the fourth embodiment in that sidewalls B of a trench 700 are formed to be perpendicular to a surface of the indented portion of the substrate 710 and a plurality of gate structures 755, a first contact junction 770A and a second contact junction 770B are disposed such that portions of the substrate 710 where the sidewalls B are disposed are allocated in the center of each channel region.

Figure 9:
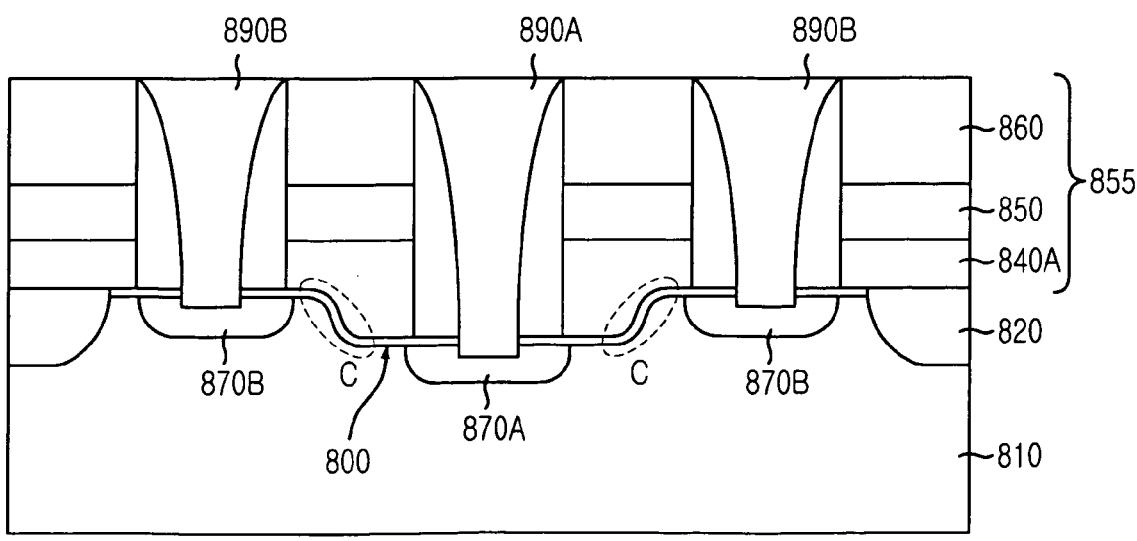
FIG. 9 is a cross-sectional view showing a structure of a memory device in accordance with a sixth embodiment of the present invention.

FIG. 9 is a cross-sectional view showing a structure of a memory device in accordance with a sixth embodiment of the present invention.

Herein, the memory device in accordance with the sixth embodiment of the present invention includes the same configuration elements described in FIG. 6. However, the memory device fabricated in accordance with the sixth embodiment is different from the memory device shown in FIG. 6 in that sidewalls C of a trench 800 is positively sloped by being narrowed down going towards a bottom portion of the trench 800.

In accordance with the first to the sixth embodiments of the present invention, a predetermined portion of the substrate with which the bit line is connected is indented and thus, the sidewalls of the indented portion of the substrate become parts of the channels. As a result, the channel length becomes elongated, thereby further resulting in a decrease in leakage current at the storage node contact junctions. Accordingly, it is possible to increase a data retention time of the memory device. Particularly, the second and the third embodiments and the fifth and the sixth embodiments provide an effect of improving margins with respect to misalignment during a gate patterning process.

The present application contains subject matter related to the Korean patent application No. KR 2004-0058871 and 2004-0059670, filed in the Korean Patent Office respectively on Jul. 27, 2004 and on Jul. 29, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A memory device, comprising:
    a substrate provided with a trench;
    a bit line contact junction formed beneath the trench;
    a plurality of storage node contact junctions formed outside the trench; and
    a plurality of gate structures each being formed on the substrate disposed between the bit line contact junction and one of the storage node contact junctions.

2. The memory device of claim 1, wherein the trench has sidewalls each being a part of a channel.

3. The memory device of claim 1, wherein sidewalls of the trench are sloped by being narrowed down going towards a bottom portion of the trench.

4. The memory device of claim 1, wherein sidewalls of the trench are formed to be perpendicular to a surface of the indented portion of the substrate.

5. The memory device of claim 1, wherein the gate structures, the bit line contact junction and the storage node contact junctions are disposed such that portions of the substrate where the individual sidewalls of the trench are positioned are allocated in the center of respective channel regions.

6. The memory device of claim 1, wherein each of the gate structures includes a first insulation layer, a polysilicon layer, a metal layer and a second insulation layer for use in a hard mask.

7. The memory device of claim 1, wherein each of the gate structures includes a first insulation layer, a planarized polysilicon layer, a metal layer and a second insulation layer for use in a hard mask.

8. The memory device of claim 6, wherein the first insulation layer and the second insulation layer are formed by using silicon oxide and silicon nitride, respectively.

9. The memory device of claim 7, wherein the first insulation layer and the second insulation layer are formed by using silicon oxide and silicon nitride, respectively.

10. A memory device, comprising:
    a substrate provided with a trench;
    a first contact junction formed beneath the trench;
    a plurality of second contact junctions formed outside the trench;

a plurality of gate structures each being formed on the substrate disposed between the first contact junction and one of the second contact junctions;

a first contact plug formed on the first contact junction by filling a space created between the gate structures; and a plurality of second contact plugs formed on the second contact junctions by filling a space created between the gate structures.

11. The memory device of claim 10, further including:

a bit line connected with the first contact junction through the first contact plug; and a plurality of storage nodes connected with the second junctions through the second contact plugs, respectively.

12. The memory device of claim 10, wherein the trench has sidewalls each being a part of a channel.

13. The memory device of claim 10, wherein sidewalls of the trench are sloped by being narrowed down going towards a bottom portion of the trench.

14. The memory device of claim 10, wherein sidewalls of the trench are formed to be perpendicular to a surface of the indented portion of the substrate.

15. The memory device of claim 10, wherein the gate structures, the first contact junction and the second contact junctions are disposed such that portions of the substrate where the individual sidewalls of the trench are positioned are allocated in the center of respective channel regions.

16. The memory device of claim 10, wherein each of the gate structures includes a first insulation layer, a polysilicon layer, a metal layer and a second insulation layer for use in a hard mask.

17. The memory device of claim 10, wherein each of the gate structures includes a first insulation layer, a planarized polysilicon layer, a metal layer and a second insulation layer for use in a hard mask.

18. The memory device of claim 16, wherein the first insulation layer and the second insulation layer are formed by using silicon oxide and silicon nitride, respectively.

19. The memory device of claim 17, wherein the first insulation layer and the second insulation layer are formed by using silicon oxide and silicon nitride, respectively.

20. The memory device of claim 10, further including a plurality of spacers formed on each sidewall of the gate structures.

* * * * *